US009543216B2

(12) United States Patent
Niimi et al.

(10) Patent No.: US 9,543,216 B2
(45) Date of Patent: Jan. 10, 2017

(54) INTEGRATION OF HYBRID GERMANIUM AND GROUP III-V CONTACT EPILAYER IN CMOS

(71) Applicant: GLOBALFOUNDRIES Inc., Grand Cayman (KY)

(72) Inventors: Hiroaki Niimi, Cohoes, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/731,480

(22) Filed: Jun. 5, 2015

(65) Prior Publication Data

US 2016/0358826 A1 Dec. 8, 2016

(51) Int. Cl.

| | | |
|---|---|---|
| *H01L 21/8238* | (2006.01) |
| *H01L 21/311* | (2006.01) |
| *H01L 21/31* | (2006.01) |
| *H01L 21/3205* | (2006.01) |
| *H01L 21/283* | (2006.01) |
| *H01L 21/3213* | (2006.01) |
| *H01L 21/321* | (2006.01) |
| *H01L 29/78* | (2006.01) |
| *H01L 29/66* | (2006.01) |
| *H01L 29/417* | (2006.01) |
| *H01L 29/45* | (2006.01) |

(52) U.S. Cl.
CPC ..... *H01L 21/823871* (2013.01); *H01L 21/283* (2013.01); *H01L 21/31* (2013.01); *H01L 21/31116* (2013.01); *H01L 21/3212* (2013.01); *H01L 21/32053* (2013.01); *H01L 21/32055* (2013.01); *H01L 21/32135* (2013.01); *H01L 29/41725* (2013.01); *H01L 29/45* (2013.01); *H01L 29/66477* (2013.01); *H01L 29/7839* (2013.01)

(58) Field of Classification Search
CPC ................ H01L 21/31; H01L 21/31116; H01L 21/32053; H01L 21/32055; H01L 21/3212; H01L 21/32135; H01L 21/823871; H01L 21/283; H01L 29/45; H01L 29/66477; H01L 29/7839; H01L 29/41725
See application file for complete search history.

(56) References Cited

U.S. PATENT DOCUMENTS

2010/0163847 A1* 7/2010 Majhi ............... H01L 21/28518
257/24
2013/0285155 A1* 10/2013 Glass .................. H01L 29/0847
257/369

OTHER PUBLICATIONS

Nishimura, "Evidence for strong Fermi-level pinning due to metal-induced gap states at metal/germanium interface", Applied Physics Letters, vol. 91, No. 12, 2007, 4 pages.

* cited by examiner

*Primary Examiner* — Fernando L Toledo
*Assistant Examiner* — Lawrence-Linh T Nguyen
(74) *Attorney, Agent, or Firm* — Ditthavong & Steiner, P.C.

(57) ABSTRACT

A trench contact epilayer in a semiconductor device is provided. Embodiments include forming trenches through an interlayer dielectric (ILD) over source/drain regions in NFET and PFET regions; depositing a conformal silicon nitride (SiN) layer over the ILD and in the trenches; removing the SiN layer in the PFET region; growing a germanium (Ge) epilayer over the source/drain regions in the PFET region; depositing metal over the ILD and in the trenches in the NFET and PFET regions; etching the metal in the NFET region to expose the conformal SiN layer; removing the SiN layer in the NFET region; growing a Group III-V epilayer over the source/drain regions in the NFET region; and depositing metal over the ILD and in the trenches in the NFET region.

15 Claims, 11 Drawing Sheets

INTEGRATION OF HYBRID GERMANIUM AND GROUP III-V CONTACT EPILAYER IN CMOS

TECHNICAL FIELD

The present disclosure relates to a trench contact epilayer in a semiconductor device. The present disclosure is particularly applicable to the integration of a hybrid germanium (Ge) and Group III-V contact epilayer in a complementary metal-oxide semiconductor (CMOS) device.

BACKGROUND

Conventional contact trench formation by way of reactive-ion etching (RIE) results in a device with poor quality. In particular, plasma damage and polymer residue in the bottom of the contact trench occur with RIE. Further, with a poly-open chemical-mechanical planarization (CMP) process, undesirable trace amounts of silicon nitride (SiN) result in contact trenches with poor quality.

The Fermi-level pinning effect is significant in many commercially important semiconductors (Silicon (Si), Germanium (Ge), and Gallium Arsenide (GaAs)), and can make the design of semiconductor devices difficult. However, Fermi-level pinning serves as an inherent benefit for Ge source/drain contacts. By using Fermi-level pinning the Schottky barrier height (SBH) lowering/optimization, contact resistance can be reduced.

A need therefore exists for methodology enabling Fermi-level pinning for both source/drain contacts, in particular, a boron doped Ge (Ge:B) trench contact for a source/drain in a PFET region and a Group III-V trench contact for a source/drain in a NFET region and the resulting device. It is critical to minimize SBH between metal Fermi-level to conduction band of semiconductor using Ge:B for PFET and to valence band of semiconductor using Group III-V for NFET.

SUMMARY

An aspect of the present disclosure is the integration of a hybrid Ge and Group III-V contact epilayer in a CMOS device. Another aspect of the present disclosure is a Ge:B trench contact for a source/drain in a PFET region and a Group III-V trench contact for source/drain in a NFET region of a CMOS device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including forming trenches through an interlayer dielectric (ILD) over source/drain regions in NFET and PFET regions; depositing a conformal SiN layer over the ILD and in the trenches; removing the SiN layer in the PFET region; growing a Ge epilayer over the source/drain regions in the PFET region; depositing metal over the ILD and in the trenches in the NFET and PFET regions; etching the metal in the NFET region to expose the conformal SiN layer; removing the SiN layer in the NFET region; growing a Group III-V epilayer over the source/drain regions in the NFET region; and depositing metal over the ILD and in the trenches in the NFET region.

Aspects of the present disclosure include forming the trenches through the ILD in the NFET and PFET regions concurrently. Other aspects include forming a blocking mask over the NFET region prior to removing the SiN layer in the PFET region, wherein the blocking mask includes an organic planarization layer (OPL). Yet another aspect includes removing the OPL prior to growing the Ge epilayer over the source/drain contacts in the PFET region. Another aspect includes the Ge epilayer including Ge:B. Further aspects include the Group III-V epilayer including GaAs, indium phosphide (InP), indium arsenide (InAs), indium antimonide (InSb), gallium antimonide (GaSb), indium gallium arsenide (InGaAs), indium nitride (InN) or aluminium gallium arsenide (AlGaAs). Other aspects include depositing a metal silicide layer prior to depositing the metal over the ILD and in the trenches in the PFET and NFET regions, wherein the metal includes titanium (Ti), copper (Cu), cobalt (Co) or tungsten (W). Further aspects includes depositing an oxide blocking mask over the PFET region prior to etching the metal in the NFET region and etching the metal silicide layer with the metal to expose the SiN layer in the NFET region. Yet another aspect includes removing the SiN layer in the NFET region prior to growing the Group III-V epilayer over the source/drain regions in the NFET region. Another aspect includes depositing a metal silicide layer prior to depositing the metal over the ILD and in the trenches in the NFET region. Another aspect includes planarizing the metal down to the ILD in the PFET and NFET regions concurrently. Further aspects include the planarizing including chemical-mechanical planarization. Yet another aspect includes forming the trenches at opposite sides of NFET and PFET gates. Another aspect includes the NFET and PFET gates each including a metal gate, spacers at opposite sides of the metal gate, and a siliconborocarbonitride (SiBCN) cap over the metal gate and spacers.

Another aspect of the present disclosure is a device including metal gates in NFET and PFET regions, each metal gate including a cap and spacers; source/drain regions located at opposite sides of a metal gate in each of the NFET and PFET regions; a Ge epilayer over the source/drain regions in the PFET region; a Group III-V epilayer over the source/drain regions in the NFET region; and metal filled trenches formed through an ILD over the Ge epilayer and Group III-V epilayer.

Aspects include a metal silicide layer deposited in the metal filled trenches, under the metal. Other aspects include the metal filled trenches being filled with a metal including Ti, Cu, Co, or W. Further aspects include the Ge epilayer including Ge:B. Yet another aspect includes the Group III-V epilayer including GaAs, InP, InAs, InSb, GaSb, InGaAs, InN or AlGaAs.

Another aspect of the present disclosure is a method including forming trenches through an ILD deposited over source/drain regions at opposite sides of metal gates in NFET and PFET regions; depositing a conformal SiN layer over the metal gates and in the trenches; forming a blocking mask over the NFET region, wherein the blocking mask includes an OPL; removing the SiN layer in the PFET region; removing the blocking mask; growing a Ge:B epilayer over the source/drain regions in the PFET region; depositing metal over the ILD and in the trenches; etching the metal in the NFET region to expose the conformal SiN layer; removing the SiN layer in the NFET region; growing a Group III-V epilayer over the source/drain regions in the NFET region, the Group III-V epilayer including GaAs, InP, InSb, InAs, InSb, GaSb, InGaAs, InN or AlGaAs; and depositing metal over the ILD and in the trenches in the NFET region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of poor quality contact trenches formed by conventional techniques including RIE. In accordance with embodiments of the present disclosure, a method and device are provided to integrate a hybrid Ge and Group III-V contact epilayer in a CMOS device. Methodology in accordance with embodiments of the present disclosure produces a device including an epilayer through contact trench without any plasma damage, polymer residue or trace amounts of SiN in contact trenches.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
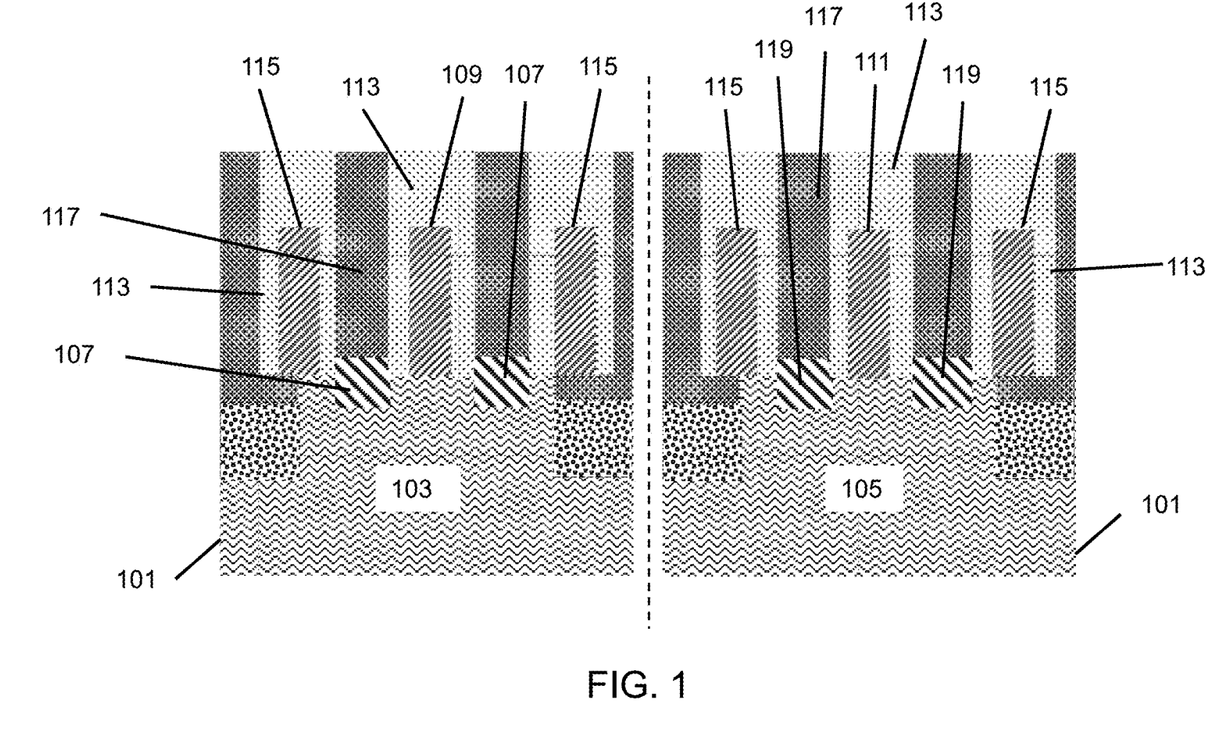
FIGS. 1 through 11 schematically illustrate cross sectional views of a process flow to produce a hybrid Ge and Group III-V contact epilayer in a CMOS device, in accordance with an exemplary embodiment.
Figure 2:
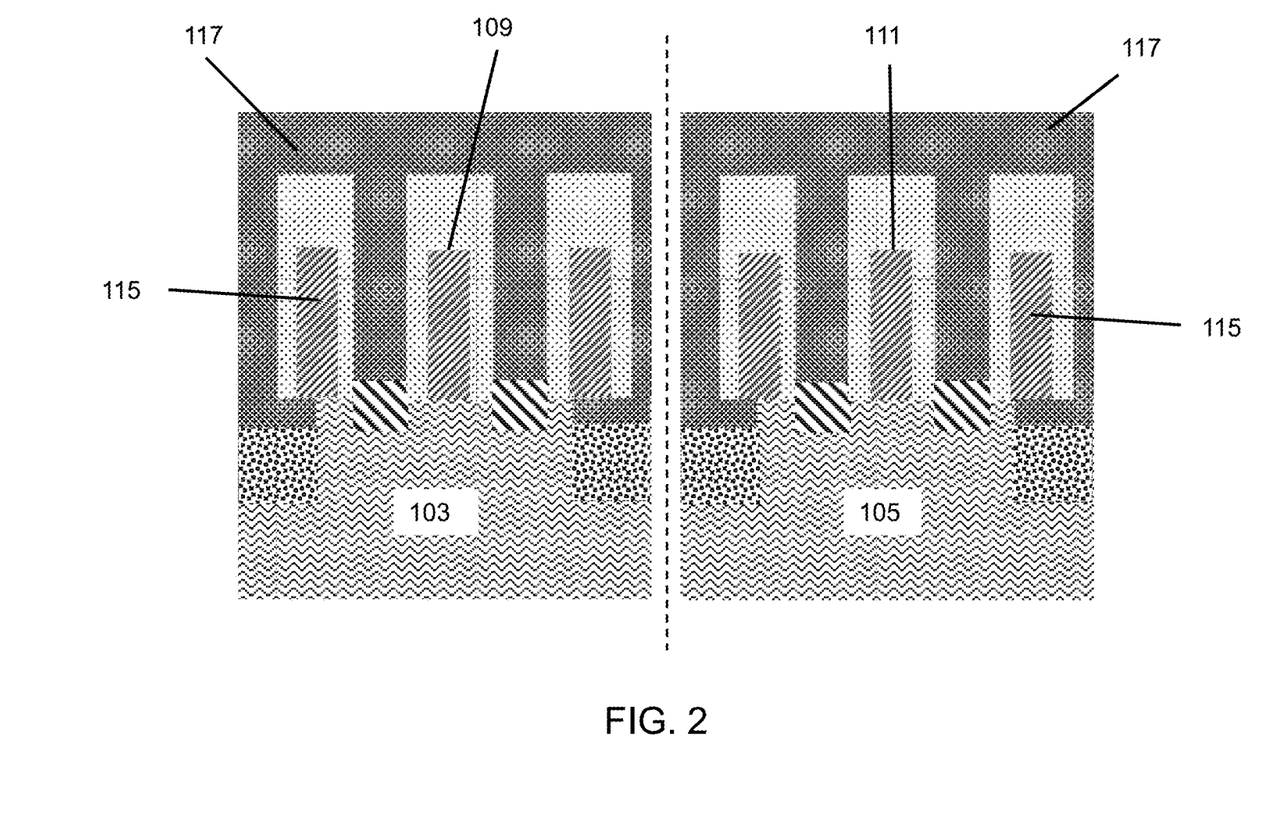

Adverting to FIG. 1, both PFET 103 and NFET 105 regions of a CMOS device are illustrated in cross-section, following self-aligned contact (SAC) and CMP processing. Source/drain regions 107 are formed on opposite sides of gate 109 on the substrate 101 and covered by the ILD 117 in the PFET 103 region. Source/drain regions 119 are formed on opposite sides of gate 111 on the substrate 101 and covered by the ILD 117 in the NFET 105 region. Gates 109 and 111 and dummy gates 115 each include a SiBCN nitride cap and side spacers 113 surrounding the gate. Dummy gates 115 are formed at the edges of the PFET 103 and NFET 105 regions. In FIG. 2, an additional ILD is deposited over the substrate to extend the ILD 117 over the gates 109 and 111 and dummy gates 115 in the PFET 103 and NFET 105 regions.

Figure 3:
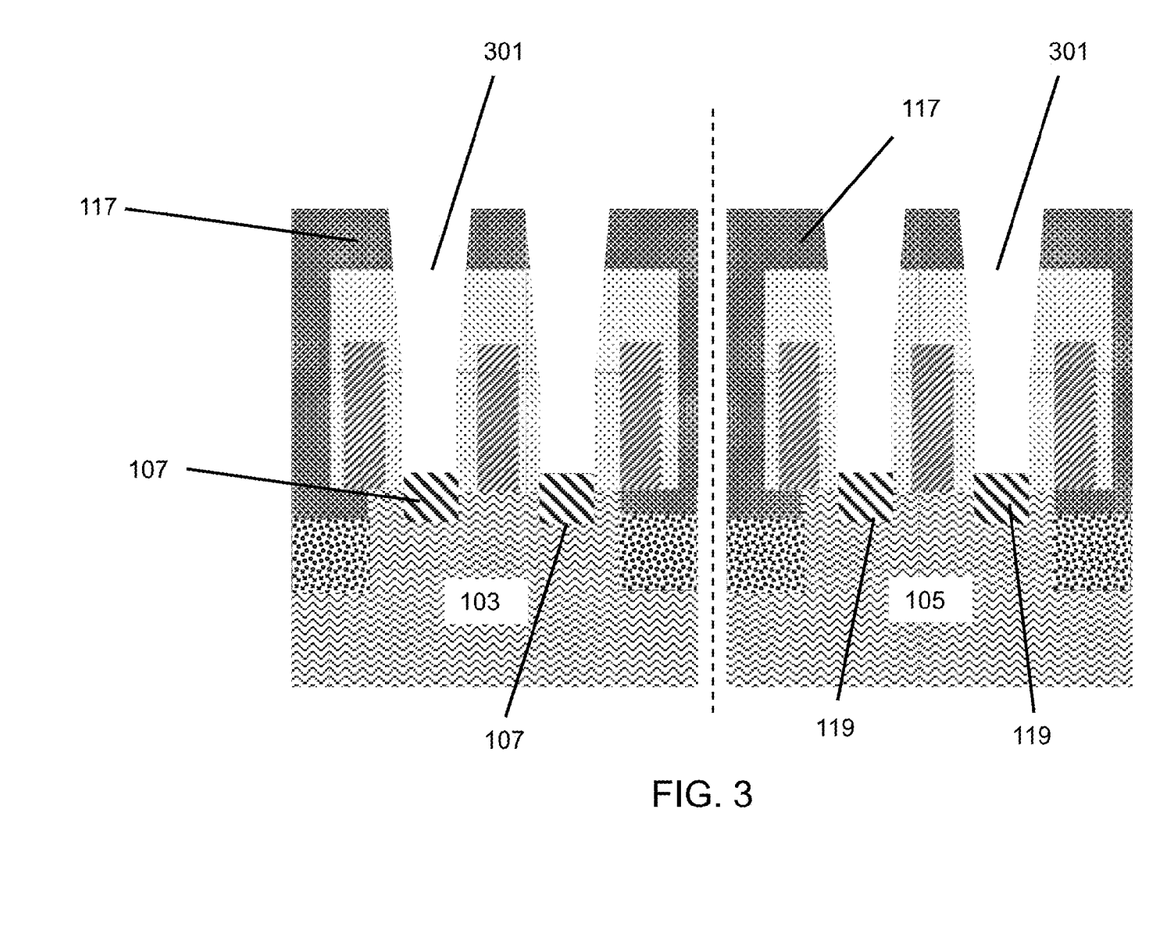

Adverting to FIG. 3, trench silicide patterning is performed over the source/drain regions 107 and 119 in the PFET 103 and NFET 105 regions, respectively. Trenches 301 are formed through the ILD 117 over source/drain regions 107 and 119. The trench silicide patterning can be performed concurrently in the PFET 103 and NFET 105 regions.

Figure 4:
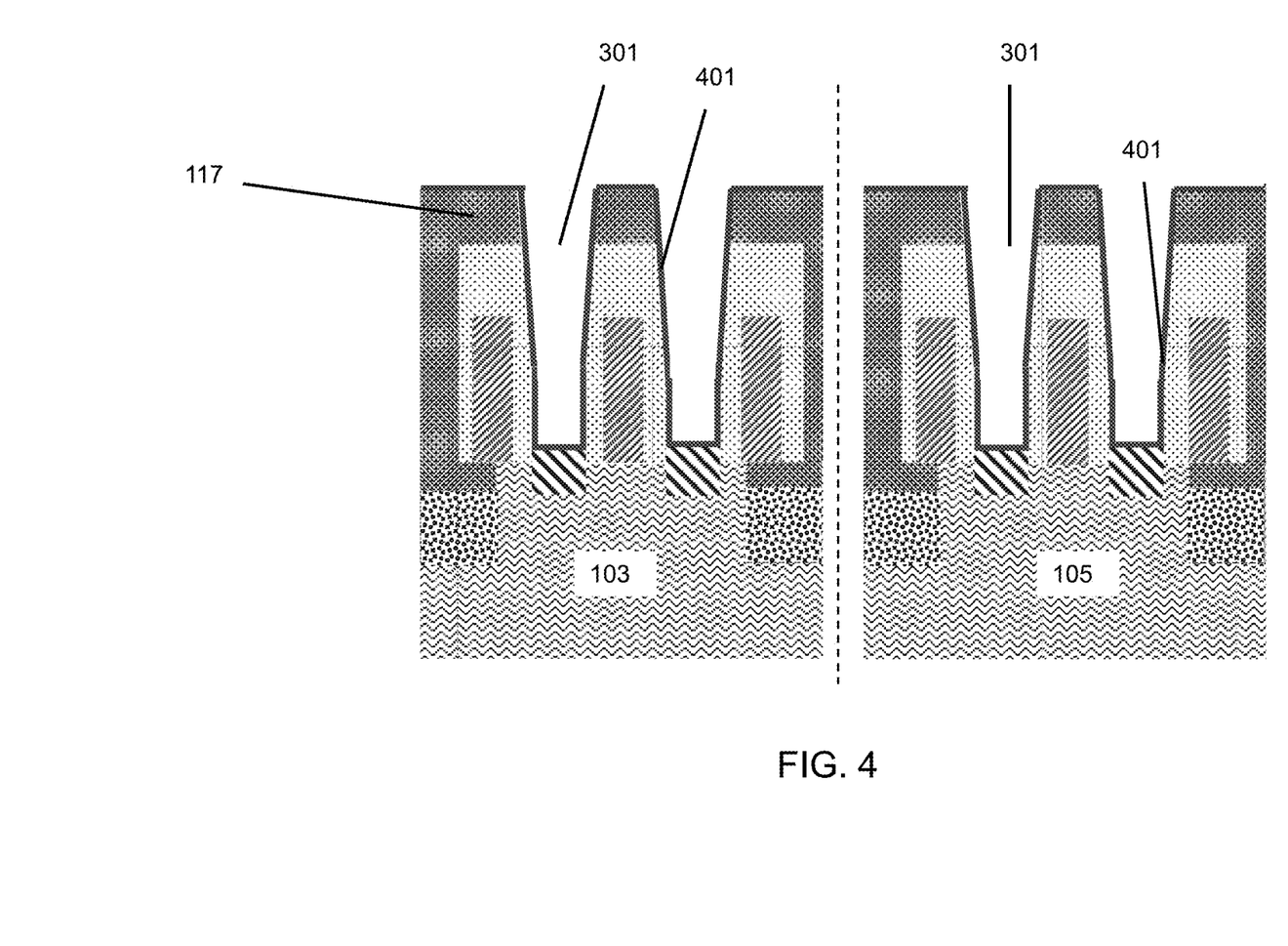

In FIG. 4, a conformal liner 401 is deposited in the PFET 103 and NFET 105 regions over the ILD 117 and in the trenches 301, covering the source/drain regions 107 and 119. The conformal liner includes SiN and may be formed to a thickness of 3 to 7 nm.

Figure 5:
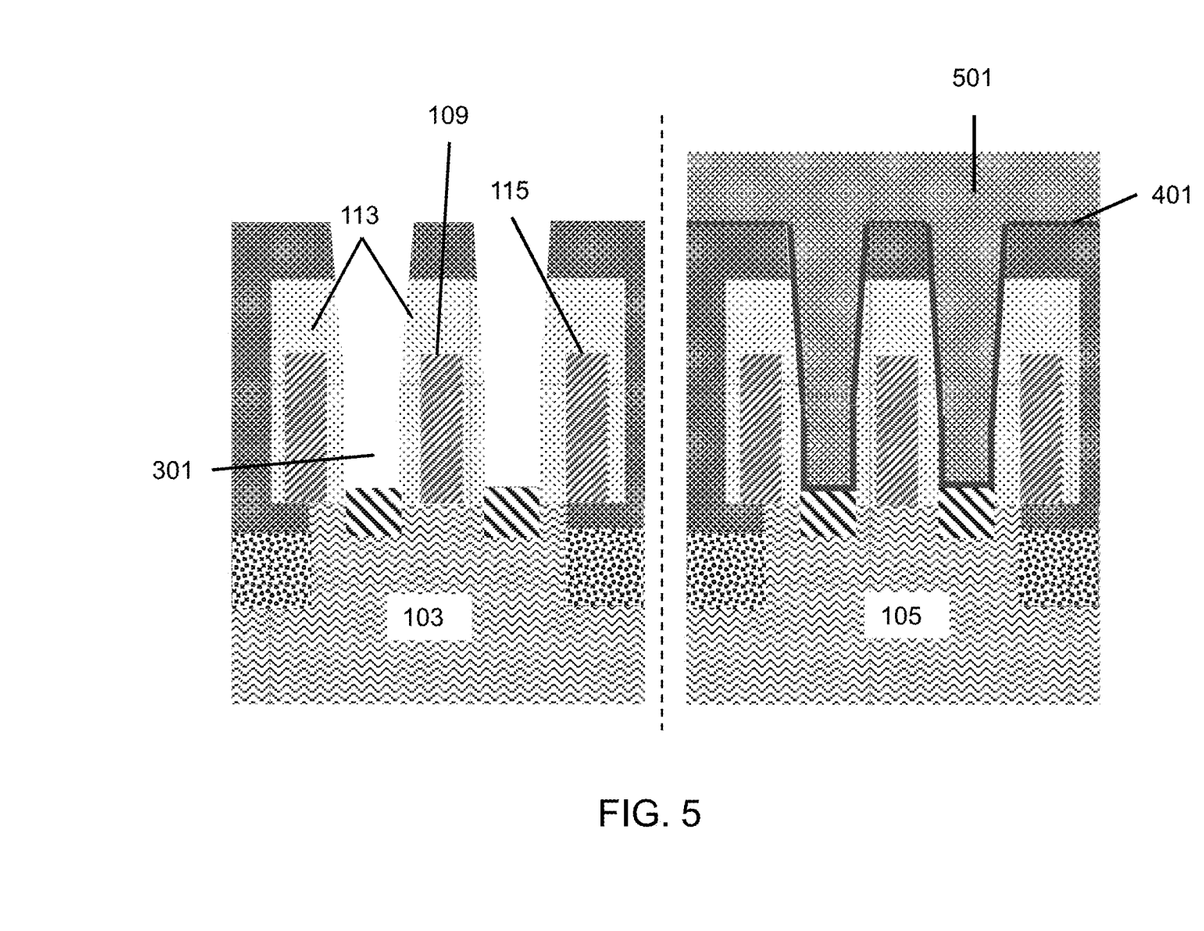

Adverting to FIG. 5, a blocking mask 501 is deposited to fill the trenches 301 in the NFET region. The blocking mask 501 includes an OPL. The blocking mask 501 is formed over the NFET region 105 followed by removing the SiN layer 401 in the PFET region 103. The SiN layer 401 in the PFET region 103 is removed by etching with an etchant that is selective to the SiBCN material of the cap and side spacers 113 around the gate 109 and dummy gates 115 in the PFET region 103.

Figure 6:
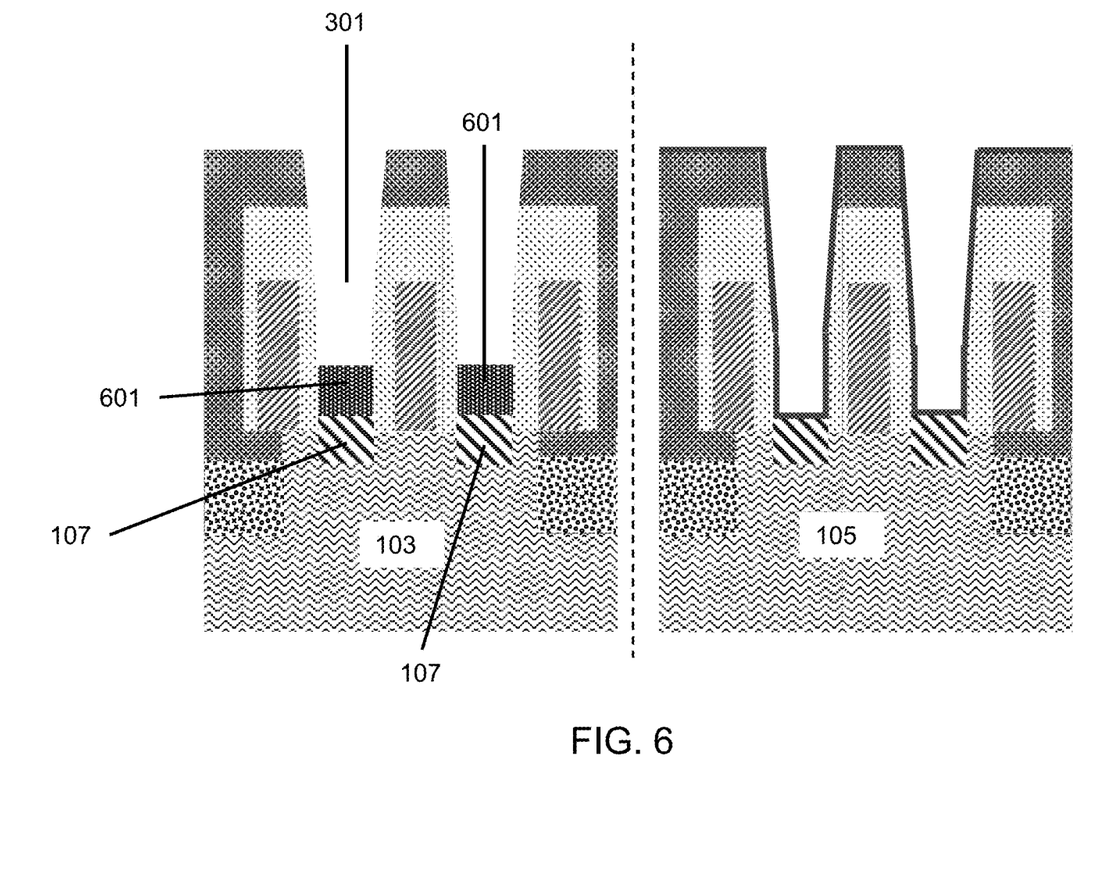

In FIG. 6, the blocking mask 501 (FIG. 5) is removed. Then, a Ge epilayer 601 is grown over the source/drain regions 107 in the PFET region 103. The Ge epilayer 601 may be formed of Ge:B. The Ge epilayer 601 may be grown to a thickness of 1 to 5 nm in the trench 301 over the source/drain regions 107.

Figure 7:
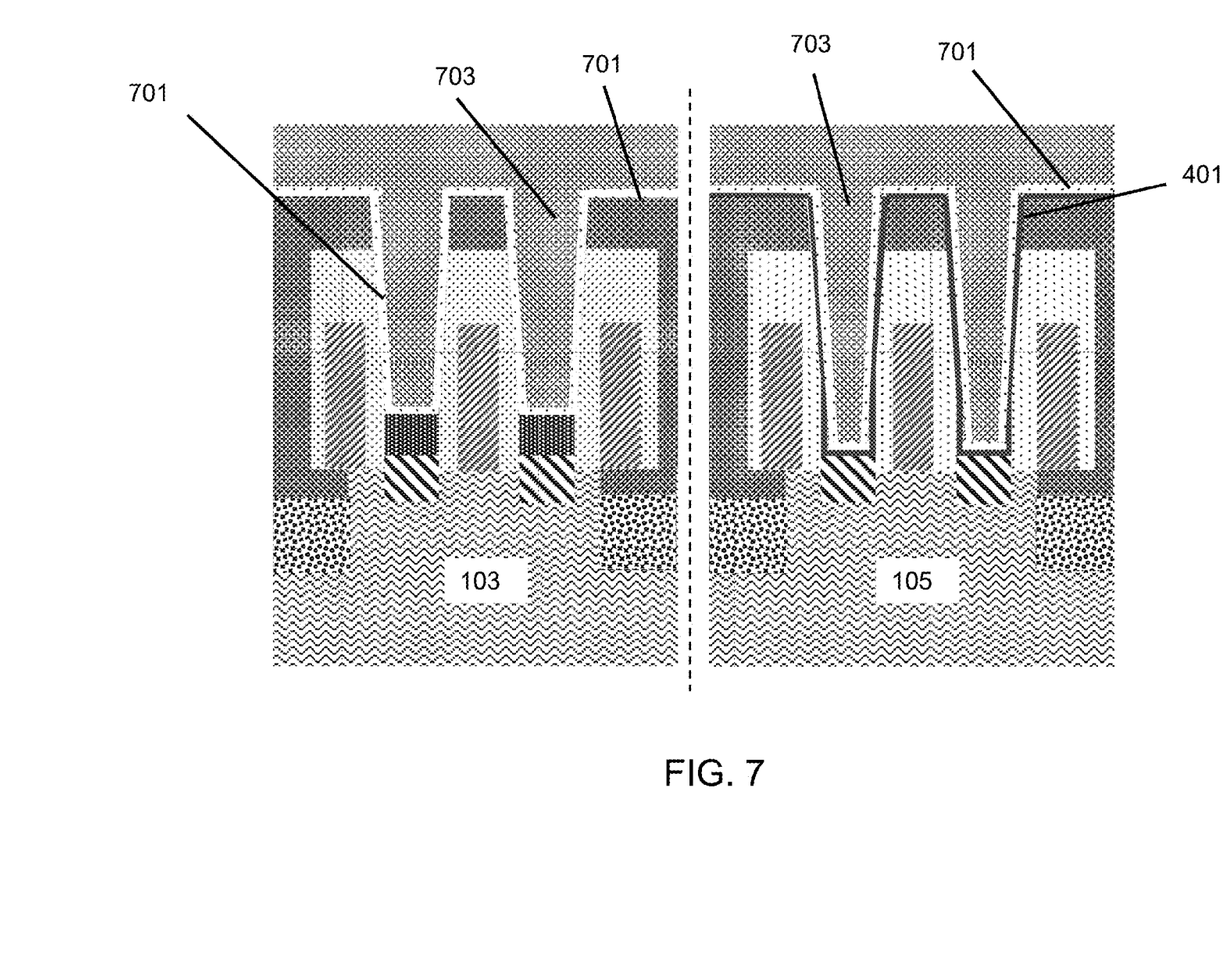

Adverting to FIG. 7, a metal silicide layer 701 is deposited in over the substrate including in the trenches of the PFET 103 and NFET 105 regions to a thickness of 2 to 10 nm. In the NFET region 105, the metal silicide is deposited over the conformal SiN liner 401. The metal silicide layer 701 is followed by the deposition of a metal 703 over the ILD 117 and in the trenches 301 in the PFET 103 and NFET 105 regions. The metal silicide 701 can include tungsten (W) and the metal 703 may be formed of W. The metal 703 and metal silicide are not required to be of the same W base metal. Other metals can be used including Ti and Cu, Co.

Figure 8:
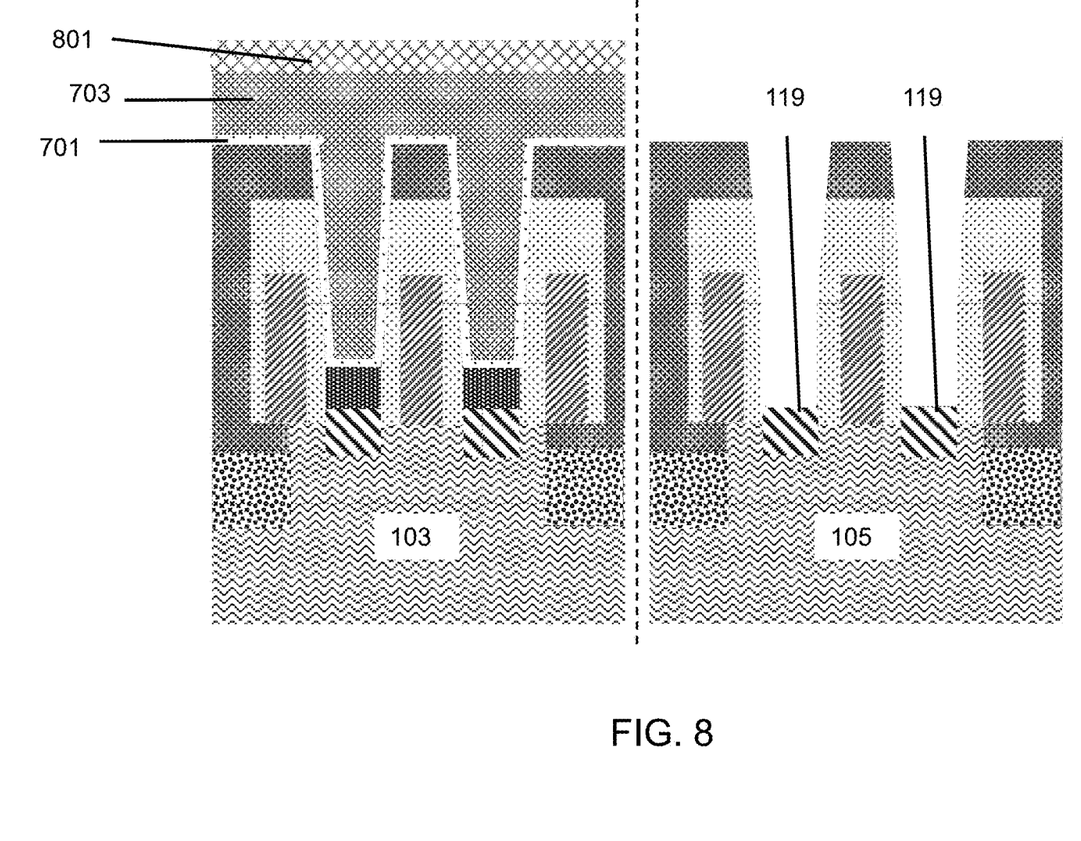

In FIG. 8, an oxide blocking mask 801 is formed over the PFET region 103 followed by etching the metal 703 in the NFET region 105. The metal silicide layer 701 is etched with the metal 703 to expose the SiN layer 401 in the NFET region 105. In FIG. 8, the SiN layer 401, metal silicide layer 701, and metal 703 have been removed, for example etched away, to expose the source/drain regions 119.

Figure 9:
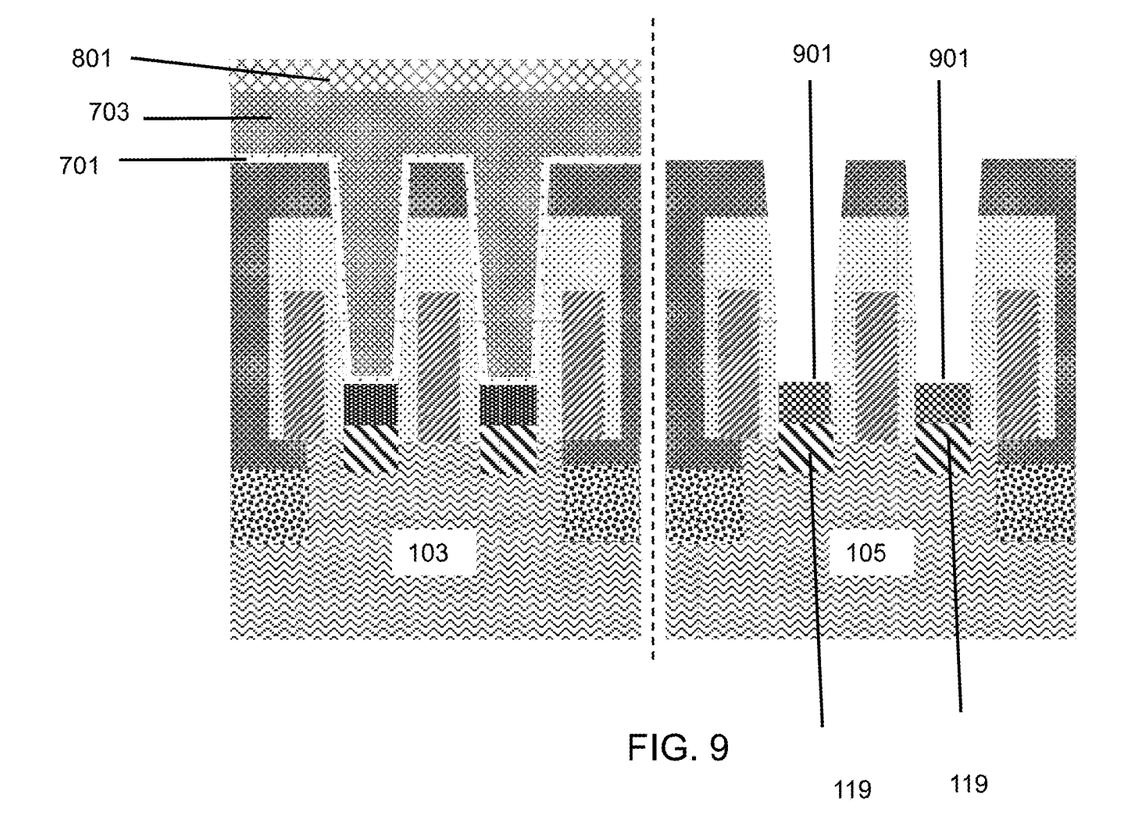

Adverting to FIG. 9, following the removal of the SiN layer 401 in the NFET region, the Group III-V epilayer 901 is formed over the source/drain regions 119 in the NFET region 105. The Group III-V epilayer 901 can include GaAs, InP, InAs, InSb, GaSb, InGaAs, InN or AlGaAsa.

Figure 10:
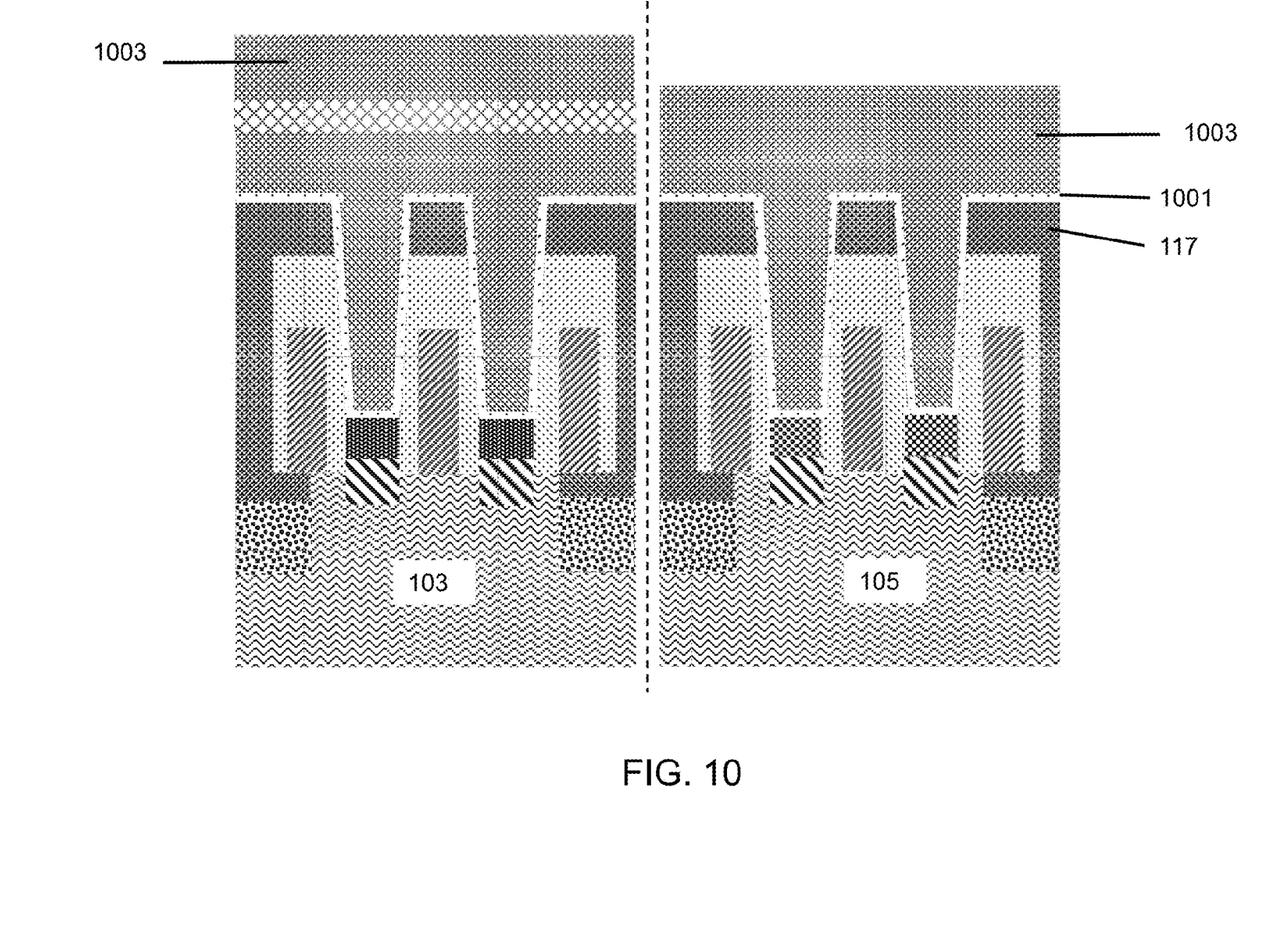

In FIG. 10, a metal silicide 1001 is deposited in the NFET region 105 followed by depositing a metal 1003 over the ILD 117 and in the trenches. The metal 1003 deposition can occur in both the PFET 103 and NFET 105 regions concurrently.

Figure 11:
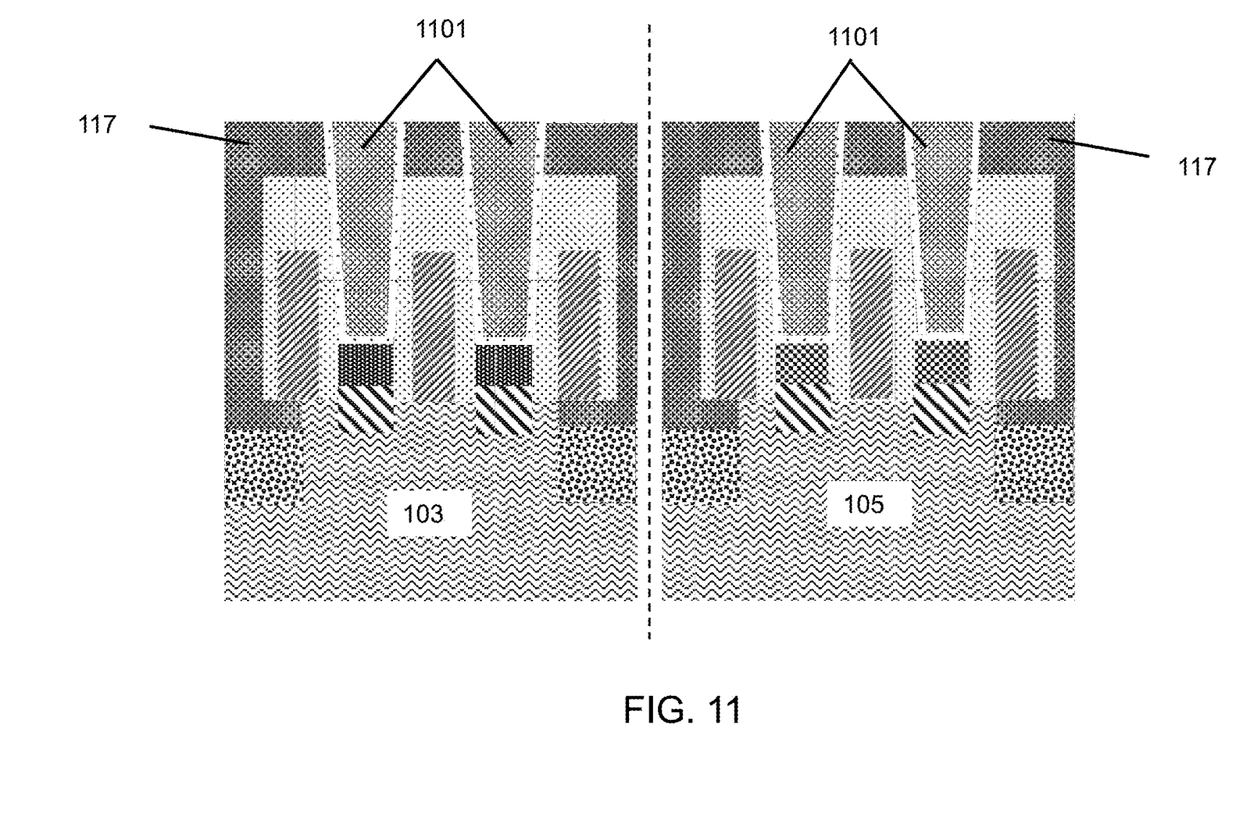

Adverting to FIG. 11, the metal 1003 is planarized down to the ILD 117 in the PFET 103 and NFET 105 regions concurrently. The planarizing step can be performed by chemical-mechanical planarization (CMP). As a result, metal filled trenches 1101 are formed over Ge:B and Group III-V contacts, respectively, in the PFET 103 and NFET 105 regions.

The embodiments of the present disclosure can achieve several technical effects, including the confinement of epilayer growth and minimized contact resistance by optimization of SBH for both the NFET and PFET regions. Source/drain trench silicide patterning for both the NFET and PFET regions can be performed concurrently. Further, metal CMP for both the NFET and PFET can be performed concurrently. Additional processing steps are limited with only an additional SiN layer, block patterning step and partial metal deposition.

Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using epilayer through contact trench processes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming trenches through an interlayer dielectric (ILD) over source/drain regions in NFET and PFET regions;
   depositing a conformal silicon nitride (SiN) layer over the ILD and in the trenches;
   removing the SiN layer in the PFET region;
   growing a germanium (Ge) epilayer over the source/drain regions in the PFET region;
   depositing metal over the ILD and in the trenches in the NFET and PFET regions;
   etching the metal in the NFET region to expose the conformal SiN layer;
   removing the SiN layer in the NFET region;
   growing a Group III-V epilayer over the source/drain regions in the NFET region; and
   depositing metal over the ILD and in the trenches in the NFET region.

2. The method according to claim 1, comprising:
   forming the trenches through the ILD in the NFET and PFET regions concurrently.

3. The method according to claim 1, comprising:
   forming a blocking mask over the NFET region prior to removing the SiN layer in the PFET region, wherein the blocking mask comprises an organic planarization layer (OPL).

4. The method according to claim 3, comprising:
   removing the OPL prior to growing the Ge epilayer over the source/drain regions in the PFET region.

5. The method according to claim 4, wherein the Ge epilayer comprises boron doped Ge (Ge:B).

6. The method according to claim 1, wherein the Group III-V epilayer comprises GaAs, InP, InAs, InSb, GaSb, InGaAs, InN or AlGaAs.

7. The method according to claim 1, comprising:
   depositing a metal silicide layer prior to depositing the metal over the ILD and in the trenches in the PFET and NFET regions,
   wherein the metal comprises Ti, Cu, Co or W.

8. The method according to claim 7, further comprising:
   depositing an oxide blocking mask over the PFET region prior to etching the metal in the NFET region and etching the metal silicide layer with the metal to expose the SiN layer in the NFET region.

9. The method according to claim 1, further comprising:
   removing the SiN layer in the NFET region prior to growing the Group III-V epilayer over the source/drain regions in the NFET region.

10. The method according to claim 9, further comprising:
    depositing a metal silicide layer prior to depositing the metal over the ILD and in the trenches in the NFET region.

11. The method according to claim 10, further comprising:
    planarizing the metal down to the ILD in the PFET and NFET regions concurrently.

12. The method according to claim 11, wherein the planarizing includes chemical-mechanical planarization.

13. The method according to claim 1, comprising forming the trenches at opposite sides of NFET and PFET gates.

14. The method according to claim 13, wherein the NFET and PFET gates each comprise a metal gate including spacers at opposite sides of the metal gate and a silicon-borocarbonitride (SiBCN) cap over the metal gate and spacers.

15. A method comprising:
    forming trenches through an interlayer dielectric (ILD) deposited over source/drain regions at opposite sides of metal gates in NFET and PFET regions;
    depositing a conformal silicon nitride (SiN) layer over the metal gates and in the trenches;
    forming a blocking mask over the NFET region, wherein the blocking mask comprises an organic planarization layer (OPL);
    removing the SiN layer in the PFET region;
    removing the blocking mask;
    growing a Ge:B epilayer over the source/drain regions in the PFET region;
    depositing metal over the ILD and in the trenches;
    etching the metal in the NFET region to expose the conformal SiN layer;
    removing the SiN layer in the NFET region;
    growing a Group III-V epilayer over the source/drain regions in the NFET region, the Group III-V epilayer comprising GaAs, InP, InAs, InSb, GaSb, InGaAs, InN or AlGaAs; and
    depositing metal over the ILD and in the trenches in the NFET region.

* * * * *